United States Patent [19]

Palazzotto

[11] Patent Number: 4,959,297

[45] Date of Patent: Sep. 25, 1990

[54] TERNARY PHOTOINITIATOR SYSTEM FOR ADDITION POLYMERIZATION

[75] Inventor: Michael C. Palazzotto, Saint Paul, Minn.

[73] Assignee: Minnesota Mining and Manufacturing Company, St. Paul, Minn.

[21] Appl. No.: 440,999

[22] Filed: Nov. 22, 1989

Related U.S. Application Data

[62] Division of Ser. No. 130,606, Dec. 19, 1987, Pat. No. 4,889,792.

[51] Int. Cl.$^5$ .................. G03C 1/725; G03C 1/053
[52] U.S. Cl. ........................... 430/322; 430/340; 430/281; 430/914; 430/925; 430/926; 522/14; 522/15; 522/25
[58] Field of Search ............... 430/332, 340, 281, 914, 430/925, 926; 522/14, 15, 25

[56] References Cited

U.S. PATENT DOCUMENTS

| | | |
|---|---|---|
| 3,729,313 | 4/1973 | Smith . |
| 3,741,769 | 6/1973 | Smith . |
| 3,808,006 | 4/1974 | Smith . |
| 4,228,232 | 10/1980 | Rousseau . |
| 4,250,053 | 2/1981 | Smith . |
| 4,257,915 | 3/1981 | Eaton . |
| 4,394,403 | 7/1983 | Smith . |
| 4,428,807 | 1/1984 | Lee et al. . |
| 4,518,676 | 5/1985 | Irving . |
| 4,632,891 | 12/1986 | Banks et al. . |
| 4,642,126 | 2/1987 | Zador et al. . |
| 4,652,274 | 3/1987 | Boettcher et al. . |
| 4,735,632 | 4/1988 | Oxman et al. . |
| 4,889,792 | 12/1989 | Palazzotto .................. 430/281 |

OTHER PUBLICATIONS

H. J. Timpe and H. Baumann, *Wiss.Z.Tech. Hochsch. Carl Schorlemmer Leuna-Merseburg*, 26, 439 (1984).
H. Baumann, and H. J. Timpe, *J. Prakt. Chem.*, 326 (4) 529 (1984).
H. Baumann, U. Oertel, and H. J. Timpe, *Eur. Polym. J.*, 22, 313 (1986).

*Primary Examiner*—Paul R. Michl
*Assistant Examiner*—Thorl Chea
*Attorney, Agent, or Firm*—Donald M. Sell; Walter N. Kirn; David L. Weinstein

[57] ABSTRACT

Photopolymerizable compositions comprising:
(1) at least one vinyl monomer capable of undergoing free radical polymerization,
(2) a visible light or ultraviolet light responsive photoinitiator system comprising:
 (a) a diaryliodonium salt,
 (b) a pigment, insoluble in the photopolymerizable composition, said pigment also serving as a sensitizer,
 (c) one or more electron donating compounds, and, optionally,
(3) adjuvants.

The three component photoinitiator system of this invention can increase, by several orders of magnitude, the rate of ultraviolet light or visible light photocuring of vinyl monomers.

15 Claims, No Drawings

TERNARY PHOTOINITIATOR SYSTEM FOR ADDITION POLYMERIZATION

This is a division of application Ser. No. 07/130,606 filed Dec. 9, 1987 now U.S. Pat. No. 4,889,792.

BACKGROUND OF THE INVENTION

1. Technical Field

This invention relates to photoinitiator systems for use in addition, i.e., free radically-initiated, polymerization.

2. Discussion of Prior Art

Addition polymerization (also referred to as free radical polymerization) of vinyl monomers by exposure thereof to radiation from the ultraviolet or visible portion of the electromagnetic spectrum is well known in the art. Polymerization of this type is also known as photopolymerization, photocuring, or curing.

Aryliodonium salts have been previously described for use as photoinitiators in addition-polymerizable compositions. References relating to such compositions include U.S. Pat. Nos. 3,729,313, 3,741,769, 3,808,006, 4,228,232, 4,250,053 and 4,428,807; H. J. Timpe and H. Baumann, *Wiss. Z. Tech. Hochsch. Leuna-Merseburg*, 26, 439 (1984); H. Baumann, B. Strehmel, H. J. Timpe and U. Lammel, *J. Prakt. Chem*, 326 (3), 415 (1984); and H. Baumann, U. Oertel and H. J. Timpe, *Euro. Polym. J.*, 22, 313 (1986).

Photopolymerizable compositions usually contain a photoinitiator system, a polymerizable monomer, and optionally adjuvants. Often pigments are added to color or opacify the compositions. The addition of pigments usually inhibits the initiation of polymerization because of competitive light absorption or light scattering, which decreases the amount of light available for absorption by the photoinitiator system. It would be desirable to be able to use pigments as part of a photoinitiator system in a photopolymerizable composition. In the present invention, insoluble sensitizers can serve both as sensitizers and colorants.

A three component system describing the use of iodonium salts, electron donor compound, and soluble sensitizer is described in U.S. Ser. Nos. 34,065 and 34,066, both filed Apr. 2, 1987.

However, these applications do not suggest the use of an insoluble pigment as a sensitizer.

U.S. Pat. No. 4,257,915 discloses semiconductors in combination with an oxidation-reduction system for producing images. This patent does not teach the use of iodonium salts or organic pigments.

SUMMARY OF THE INVENTION

This invention provides compositions that are photopolymerizable by both visible light and ultraviolet (UV) light. More specifically, this invention provides photopolymerizable compositions comprising:

(1) at least one vinyl monomer capable of undergoing free radical polymerization, (2) a visible light or ultraviolet light responsive photoinitiator system comprising:
 (a) a diaryliodonium salt,
 (b) an organic or inorganic pigment, insoluble in the photopolymerizable composition, said pigment also serving as a sensitizer,
 (c) one or more electron donating compounds selected from the group of compounds that possess a potential ($E_{ox}$, donor) between about 0.5 and 1.5 volts versus a saturated calomel electrode ("S.C.E."), and, optionally, (3) adjuvants.

This invention also provides methods for the preparation of photopolymerized compositions.

Compositions of the present invention provide a very useful combination of cure speed, cure depth, and shelf life. They can be used in a variety of applications, including graphic arts imaging (e.g., for color proofing systems, curable inks, or silverless imaging), printing plates (e.g., projection plates or laser plates), photoresists, solder masks, coated abrasives, magnetic media, photocurable adhesives (e.g., for orthodontics), and photocurable composites (e.g., for automobile repair or dentistry e.g., dental restoratives).

DETAILED DESCRIPTION OF THE INVENTION

Light responsive photoinitiator systems for initiation of the polymerization of vinyl monomers comprise an inorganic or organic pigment, an electron donating, or donor, compound, and an electron accepting or acceptor, compound, such as, for example, onium salts. A wide variety of monomers can be photopolymerized using the photoinitiator system of this invention. Suitable monomers for this invention contain at least one ethylenically unsaturated double bond and are capable of undergoing addition polymerization. These monomers can also be oligomers. Suitable monomers include (1) mono-, di- or poly- acrylates and methacrylates, such as, for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate; (2) bis-acrylates and bis-methacrylates of polyethylene glycols of molecular weight 200-500, copolymerizable mixtures of acrylated monomers such as those described in U.S. Pat. No. 4,652,274, and acrylated oligomers such as those described in U.S. Pat. No. 4,642,126; (3) unsaturated amides such as, for example, acrylamide, methylene bis-acrylamide, methylene bis-methacrylamide, 1,6-hexamethylene bis-acrylamide, diethylene triamine tris-acrylamide, and beta-methacrylaminoethyl methacrylate; and (4) vinyl compounds such as, for example, styrene, diallyl phthalate, divinyl succinate, divinyl adipate, and divinylphthalate. Mixtures of two or more monomers can be used if desired.

The monomer is combined with a three component or ternary photoinitiator system. The first component in the photoinitiator system is a diaryliodonium salt. The diaryliodonium salt should be soluble in the photopolymerizable composition and preferably is shelf-stable (i.e., does not spontaneously promote polymerization) when dissolved therein in the presence of the pigment sensitizer and donor. Accordingly, selection of a particular diaryliodonium salt depends, to some extent, upon the particular monomer, pigment sensitizer and donor chosen. Diaryliodonium salts suitable for the present invention are described in U.S. Pat. Nos. 3,729,313, 3,741,769, 3,808,006, 4,250,053 and 4,394,403, the disclosures of which relating to aryliodonium salts are incorporated herein by reference. The diaryliodonium salt can be a simple salt (e.g., containing an anion such as Cl⁻, Br⁻, I⁻ or $C_6H_5SO_3^-$) or a metal or metalloid complex salt (e.g., containing an anion such as $BF_4^-$, $PF_6^-$, $SbF_6^-$, $SbF_5OH^-$ or $AsF_6^-$). Mixtures of diaryliodonium salts can be used if desired.

Preferred diaryliodonium salts include diphenyliodonium salts such as diphenyliodonium chloride, diphenyliodonium hexafluorophosphate, and diphenyliodonium tetrafluoroborate.

The second component in the photoinitiator system is the pigment sensitizer. The pigment sensitizer can be an organic or inorganic material that:
(1) is generally not soluble (solubility less than about 0.1 percent) in the photopolymerizable composition,
(2) absorbs energy in a certain portion of the electromagnetic spectrum (for visible light, absorption is usually from about 380 to about 750 nanometers (nm) and for ultraviolet light, absorption is usually from about 300 to about 380 nm), i.e. displays a band gap energy of about 1.5 to about 4.0 electron volts, and
(3) behaves as a semiconductor, i.e., is capable of undergoing photoredox reactions.

In conventional photosensitive compositions, pigments are usually viewed as a hindrance, because, by their nature, they competitively absorb light. Surprisingly, it has been found that insoluble organic and inorganic pigments actually serve as visible light and ultraviolet light photosensitizers for the light initiated polymerization of vinyl monomers when they are in combination with an aryliodonium salt and an electron donor compound. Thus, certain pigments can actually replace soluble dyes, which are normally used as sensitizers. It is preferred that the pigment be dispersible with at least one of the other components of the photopolymerizable composition.

Inorganic pigments suitable for use as sensitizers in this invention are described in U.S. Pat. No. 4,257,915 and include, for example, titanium dioxide, strontium titanate, barium titanate, zinc oxide, zinc sulfide, zinc selenide, cadmium sulfide, cadmium selenide, cadmium telluride. Organic pigments suitable for use as sensitizers in this invention include, for example, phthalocyanine blue (pigment blue 15), copper polychlorophthalocyanine green (pigment green 7), copper polybromochlorophthalocyanines (pigment green 36), perylene scarlet (vat red 29), perylene vermillion (pigment red 123), perylene maroon, perylene bordeaux, perylene dianhydride (perylene red), and others such as those described in "Pigments-Inorganic" and "Pigments-Organic" in Kirk-Othmer *Encyclopedia of Chemical Technology*, Third ed., Volume 17, John Wiley and Sons (New York: 1982) pp. 788–871, semiconducting polymers (see Ya. M. Paushkin, et al., *Organic Polymeric Semiconductors*, John Wiley & Sons, (New York: 1974), and photoconducting polymers (such as described in J. M. Pearson, Pure and Appl. Chem., 49, 463–477 (1977)).

The third component in the photoinitiator system is the electron donor. A wide variety of donors can be employed. The donor should not only be soluble in the photopolymerizable composition, but should also meet the oxidation potential ($E_{ox}$) requirements discussed in more detail below. Preferably, the donor is also selected on the basis of shelf stability. Accordingly, selection of a particular donor depends, in part, on the particular monomer, diaryliodonium salt, and pigment chosen. Donors are capable of increasing the speed of cure or depth of cure of a composition of the invention upon exposure to light of the desired wavelength. Preferably, $E_{ox}$ of the donor is between about 0.5 and 1.5 volts versus a saturated calomel electrode ("S.C.E."). Values of $E_{ox}$ of the donor can be measured experimentally, or obtained from references such as N. L. Weinburg, Ed., *Technique of Electroorganic Synthesis Part II Techniques of Chemistry*, Vol. V (1975), and C. K. Mann and K. K. Barnes, *Electrochemical Reactions in Nonaqueous Systems* (1970).

Preferred donors include amines (including aminoaldehydes and aminosilanes), amides (including phosphoramides), ethers (including thioethers), ureas (including thioureas), ferrocene and its derivatives, sulfinic acids and their salts, salts of ferrocyanide, ascorbic acid and its salts, dithiocarbamic acid and its salts, salts of xanthates, salts of ethylene diamine tetraacetic acid, and salts of tetralkyl and tetraaryl borates. The donor can be unsubstituted or substituted with one or more substituents that do not adversely affect the photopolymerization reaction.

Preferred amine donor compounds include alkyl-, aryl-, alkaryl- and aralkyl-amines, such as, for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4,-trimethylenedipiperidine, 4,4'-ethylenedipiperidine, p-N,N-dimethylaminophenethanol and p-N,N-dimethylaminobenzonitrile; aminoaldehydes, such as, for example, p-N,N-dimethylaminobenzaldehyde, p-N,N-dierhylaminobenzaldehyde, 9-julolidine carboxaldehyde, and 4-morpholinobenzaldehyde; and aminosilanes, such as, for example, trimethylsilylmorpholine, trimethylsilylpiperdine, bis(dimethylamino)diphenylsilane, tris(dimethylamino)methylsilane, N,N diethylaminotrimethyl]silane, rris(dimethylamino)phenylsilane, tris(methylsilyl)amine, tr:s(dimethylsilyl)amine, bis(dimethylsilyl)amine, N,N-bis(dimethylsilyl)aniline, N-phenyl-N-dimethylsilylanil:ne and N,N-dimethyl-N-dimethylsilylamine. Tertiary aromatic alkylamines, particularly those having at least one electron-withdrawing group on the aromatic ring, have been found to provide especially good shelf stability.

Preferred amide donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, and tripiperidinophosphine oxide.

Suitable ether donor compounds include 4,4,-dimethoxybiphenyl, 1,2,4-trimethoxybenzene, and 1,2,4,5-tetramethoxybenzene.

Suitable urea donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, and N,N'-diphenyl-N,N'-diethylthiourea.

The three necessary components of the composition of this invention are present in "photochemically effective amounts", that is, the amount of each component must be sufficient to enable the monomer to undergo photochemical gelation or hardening upon exposure to light of the desired wavelength. Amounts of each component are independently variable and thus need not be equal, with larger amounts of diaryliodonium salt and/or electron donor compound generally providing faster cure, but shorter shelf life. Use of too much pigment or improper preparation of the dispersion can adversely affect the cure.

Compositions of this invention can contain a wide variety of adjuvants depending upon the desired end use. Classes of adjuvants suitable for this invention include solvents, diluents, resins, binders, plasticizers, dyes, inorganic or organic reinforcing or extending fillers, thixotropic agents, indicators, surfactants, inhibitors, stabilizers, UV absorbers, dispersing aids, and the like. An additional component that can be added to the composition of this invention is a radiation-sensitive dye. Suitable dyes include those that sensitize the photoconductivity of semiconductor pigments, particularly those that absorb visible radiation. Such dyes are discussed by Meier in *Spectral Sensitization*, Focal Press Limited, London, 1968, pp. 101 to 110. Examples of such suitable dyes include Acriflavine CI 46000, Rose Bengal CI 45435, Acridine Orange CI 46005, Kryptocyanine, Fuchsine, Malachite Green, Erythrosine, Eosine, Fluorescein, Phthalocyanine, and merocyanine dyes as taught in U.S. Pat. No. 4,257,915. Amounts and types of such adjuvants, and their manner of addition to a composition of the invention will be familiar to those skilled in the art.

Suitable ratios of ingredients include the following: for every 100 parts by weight of the photopolymerizable composition there may be present from 1 to 99 parts by weight vinyl monomer, from 0.001 to 50 parts by weight pigment sensitizer, from 0.005 to 10 parts by weight of diaryliodonium salt, from 0.005 to 10 parts by weight of donor compound, from 0 to 99 parts by weight of adjuvants. Preferably there is used per 100 parts by weight of the photopolymerizable composition from 5 to 60 parts by weight vinyl monomer, 0.1 to 30 parts by weight of pigment sensitizer, 0.1 to 5 parts by weight of diaryliodonium salt, 0.1 to 5 parts by weight of donor compound, and from 5 to 90 parts by weight of adjuvants.

In making the photosensitive compositions of this invention, the pigment sensitizer, diaryliodonium salt, donor compound, polymerizable monomer or monomers, and optionally adjuvants can be combined in any order and mixed until a homogeneous dispersion or mixture is obtained. Fillers and other adjuvants can be added as desired. It has been found desirable to store the compositions of this invention away from light until it is desired to initiate polymerization by the intentional exposure to light.

Compositions of this invention can be cured by means of a variety of methods. It is convenient to expose the compositions to actinic radiation by employing light sources that emit ultraviolet or visible light, such as, for example, quartz halogen lamps, tungsten-halogen lamps, mercury arcs, carbon arcs, low-, medium-, and high-pressure mercury lamps, plasma arcs, light emitting diodes and lasers. Electron beam ("E-beam") irradiation and other curing devices that do not depend on light emission can also be employed. In general, heat applied during or after exposure and/or an inert atmosphere will accelerate cure.

Insoluble sensitizer pigments are introduced as dispersions in place of the usual soluble organic sensitizers. Dispersions can be prepared by dispersing the pigment in water. While not necessary, surfactants and water soluble polyvinylalcohol (PVA) can be used as additives in the preparation of the dispersions. Stock dispersions can be prepared by means of a ball mill. A photoinitiator system comprising a mixture of this dispersion, an electron donor compound, and a diaryliodonium salt, can be used to polymerize a vinyl monomer by means of exposure to visible or ultraviolet light.

The three component photoinitiator system of this invention has increased by several orders of magnitude the rate of ultraviolet light or visible light photocuring of vinyl monomers.

This invention is further illustrated by the following examples, but the particular materials and amounts thereof recited in these examples, as well as other conditions and details, should not be construed to unduly limit this invention to the illustrative embodiments set forth herein.

EXAMPLES

In the following examples, parts are reported as parts by weight and all percentages are given as percentages by weight unless indicated otherwise. All temperatures are reported in degrees centigrade and examples were conducted at ambient temperature (about 20-25° C.) unless indicated otherwise. Monomers, diaryliodonium salts, pigments, electron donor compounds, adjuvants, resins, and the like used in the examples were commercially available unless indicated otherwise.

Light used to initiate the polymerizations was from a visible light source unless indicated otherwise.

EXAMPLES 1-4

The following example describes the use of pigments as sensitizers to initiate free radical polymerization of vinyl monomers using the three component photoinitiator system, i.e., pigment, diaryliodonium salt, and electron donor compound.

Pigments used in this example were prepared as water dispersions according to the following procedure: a solution containing polyvinylalcohol (PVA) (12 g), cetyltrimethylammonium bromide surfactant (0.2 g, Aldrich Chemical Co., Milwaukee, WI) and water (200 g) was prepared. Two different polyvinyl alcohols, both of which are commercially available from Aldrich Chemical Co., Milwaukee, WI, were used; one had a molecular weight of 2,000 and was 75% hydrolyzed, and the other had a molecular weight of 10,000 and was 88% hydrolyzed. To the solution was added 5 g of the desired pigment. The resultant mixture was placed on a ball mill and milled until a satisfactory stock dispersion was obtained as indicated by visual examination of the dispersion spread on a glass slide through a 100 X microscope. Fine particles indicated a good, suitable dispersion.

For each sample, a dilution of 1/19, volume per volume, dispersion/water was made. A 4 ml portion of this diluted mixture was placed in a "Pyrex" test tube, and acrylamide (about 0.3 g) was added thereto. Depending on the sample, either sodium p-toluenesulfinate (about 0.03 g) or diphenyliodonium chloride (about 0.03 g) or both were added. Each sample was purged with nitrogen for two minutes before and continuously during a five minute exposure to a light source ("Kodak Carousel" projector, 500 watts) using a 400 nm filter between the source and sample. Each sample was then poured into methanol (30 ml) to cause precipitation of any polymer. The following table shows polymerization results of compositions of the present invention, along with comparative results. In the table, column A shows results for compositions containing pigment plus sodium p-toluenesulfinate, column B shown results for compositions containing pigment plus diphenyliodonium chloride, and column C shows results for compositions containing pigment, sodium p-toluenesulfinate, and diphenyliodonium chloride.

In the table, N means no polymer was detected, S means a small amount of polymer was formed, and P means a large amount of polymer was formed.

TABLE I

| Example | Pigment | A | B | C |
|---|---|---|---|---|
| 1 | Phthalocyanine Blue[1] | N | N | P |
| 2 | Perylene Red[1] | S | N | P |
| 3 | Cadmium Sulfide[2] | S | N | P |
| 4 | Poly(p-aminobenzaldehyde)[2] | S | N | P |

[1]PVA, molecular weight 2000, 75% hydrolyzed, 0.2 g surfactant ("Triton X-100") added to dispersion.
[2]PVA, molecular weight 10000, 88% hydrolyzed. Only the samples containing pigment underwent decided polymerization.

EXAMPLES 5-8

The following example describes a coating formulation comprising a mixture of vinyl monomers, a diaryliodonium salt, an electron donor compound, and a pigment as a sensitizer and a process wherein the mixture is photopolymerized to provide a coated film. The sensitizer pigments of the examples are indicated in Table 2 below. The example shows the increase in speed provided by photoinitiator systems containing pigment sensitizer, diaryliodonium salt, electron donor compound (ternary systems) as compared to photoinitiator systems containing pigment sensitizer-diaryliodonium salt or pigment sensitizer-electron donor compound (binary systems) for the initiation of free radical polymerization.

Stock coating formulations were prepared by using a suitable stock dispersion of the pigment prepared according to the process set forth in Examples 1-4 and adding to it 12 g of acrylamide and 1 g of N,N'-methylenebisacrylamide, followed by ball milling until mixing was complete. A small amount of surfactant, about 0.05 g of "Triton X-100" surfactant or "Nelkal NF" surfactant (GAF Corporation, New York, NY), was added to improve the coating characteristics of these formulations.

Coating samples were prepared by taking 25 g of the above stock coating formulation and adding 0.1 g of the appropriate electron donor compound and/or diaryliodonium salt. Samples were coated onto a substrate of gelatin-subbed 3 mil polyester film (3M Co., St. Paul, MN) using a number eighteen wire wound rod. The coated film was dried first by a heat gun and then in an oven at 60° C. for three minutes. All manipulations using visible light sensitive materials were performed under red safelights and UV sensitive materials were correspondingly handled under yellow safelights. Visible light exposures were made with a Model 70 tungsten light source (3M Co., St. Paul, MN) in a commercial vacuum frame and UV exposures were made with a 2 kilowatt Berkey Ascor (Berkey Technical Company, Woodside, N.Y.) light source with photopolymer bulb in a commercial vacuum frame.

The resultant exposed, coated films were then washed with a water/methanol solvent mixture for development to remove unpolymerized material. Polymerization in a coated film was detected by exposing a film in an imagewise manner and revealing the retained image by washing of the film to remove unpolymerized materials. Relative speed of polymerization was determined by the number of steps of a Stouffer 21 step wedge (Stouffer Graphic Arts, South Bend, IN) remaining after washing. In Table 2 column A shows results for compositions containing pigment plus sodium p-toluenesulfinate, column B shown results for compositions containing pigment plus diphenyliodonium chloride, and column C shows results for compositions containing pigment, sodium p-toluenesulfinate, and diphenyliodonium chloride.

TABLE 2

| Ex-ample | Pigment | Light source | Number of steps | | |
|---|---|---|---|---|---|
| | | | A | B | C |
| 5 | Phthalocyanine Blue[1,5] | Visible | N | L | 8 |
| 6 | Perylene Red[1,4,5] | Visible* | N | L | 14 |
| 7 | Poly (p-aminobenzaldehyde)[3,4,6] | Visible* | N | N | 10 |
| 8 | Cadium Sulfide[3,4,5] | UV | L | L | 13 |
| 9 | Zinc Oxide[2,3,6] | UV | L | L | 7 |
| | Titanium Dioxide[2,3,6] | UV | L | L | 8 |

*10 second light exposure
[1]PVA, molecular weight 2000, 75% hydrolyzed.
[2]PVA, molecular weight 10000, 88% hydrolyzed.
[3]surfactant ("Triton X-100") added.
[4]surfactant ("Nekal-NF") added.
[5]3/20, V/V, methanol/water used for development.
[6]3/10, V/V, methanol/water used for development.

Results area shown in Table 2 where N means that no image was formed and L means that an image was formed but was lost upon development. Where exposures were made of coated films without the added diaryliodonium salt/electron donor compound, no image was detected except in the case of cadmium sulfide. This image was lost on washing. Coatings containing only the diaryliodonium salt/electron donor compound combination did not image under these conditions.

What is claimed is:
1. A method for addition photopolymerization comprising the step of irradiating a photopolymerizable composition comprising:
   (a) at least one vinyl monomer capable of undergoing free-radical polymerization, and
   (b) a photoinitiator system comprising photochemically effective amounts of
      (i) a diaryliodonium salt,
      (ii) an organic or inorganic pigment, insoluble in the photopolymerizable composition, which serves as a sensitizer, and
      (iii) at least one electron donor compound, said donor compound being different from said pigment and having a potential between about 0.5 and 1.5 volts versus a saturated calomel electrode,
with light having a wavelength between about 300 and about 1000 nanometers until said composition gels or hardens.
2. The method of claim 1, wherein said diaryliodonium salt comprises a diphenyliodonium simple salt or diphenyliodonium metal complex salt.
3. The method of claim 1, wherein said sensitizer pigment is selected from the group consisting of phthalocyanine, porphyrins, and perylenes.

4. The method of claim 1, wherein said sensitizer pigment is a phthalocyanine.

5. The method of claim 1, wherein said sensitizer pigment is a porphyrin.

6. The method of claim 1, wherein said sensitizer pigment is a perylene.

7. The method of claim 1, wherein said sensitizer pigment is selected from the group consisting of cadmium sulfide, cadmium selenide, cadmium telluride, zinc oxide, zinc sulfide, and titanium dioxide.

8. The method of claim 1, wherein said $E_{ox}$(donor) is between about 0.5 and 1 volt versus a saturated calomel electrode.

9. The method of claim 1, wherein said donor is selected from the group consisting of amines, amides, ethers, ureas, ferrocene derivatives, sulfinic acids and their salts, ferrocyanide salts, ascorbic acid and its salts, dithiocarbamic acid and its salts, xanthate salts, ethylene diamine tetraacetic acid salts, tetraalkyl borate salts, and tetraaryl borate salts.

10. The method of claim 1, wherein said donor compound comprises sulfinic acid salts.

11. The method of claim 1, wherein said donor compound comprises a member of the group selected from tetraalkyl and tetraaryl borate salts.

12. The method of claim 1, wherein said composition contains, for every 100 parts by weight of composition, about 1 to 99 parts by weight of said monomer, about 0.001 to about 50 parts by weight of said sensitizing pigment, and about 0.005 to about 10 parts by weight of said donor compound.

13. The method of claim 1, wherein said composition contains, for every 100 parts by weight of said composition, about 5 to 60 parts by weight of said monomer, about 0.1 to about 5 parts by weight each of said diaryliodonium salt, about 0.1 to about 3 parts by weight of said sensitizing pigment, and about 0.1 to about 5 parts by weight of said donor compound.

14. The method of claim 1, wherein said composition further comprises about 10% to 90% by weight of fillers, based on the total weight of said composition.

15. The method of claim 1, further including adjuvants.

* * * * *